United States Patent
Kashiwaya et al.

(10) Patent No.: US 8,456,066 B2
(45) Date of Patent: Jun. 4, 2013

(54) PIEZOELECTRIC / ELECTROSTRICTIVE MATERIAL, PIEZOELECTRIC / ELECTROSTRICTIVE CERAMIC COMPOSITION, PIEZOELECTRIC / ELECTROSTRICTIVE ELEMENT, AND PIEZOELECTRIC MOTOR

(75) Inventors: Toshikatsu Kashiwaya, Inazawa (JP); Yuya Kikuta, Nagoya (JP); Tomohiko Hibino, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 269 days.

(21) Appl. No.: 12/792,860

(22) Filed: Jun. 3, 2010

(65) Prior Publication Data
US 2011/0006639 A1    Jan. 13, 2011

Related U.S. Application Data

(60) Provisional application No. 61/224,489, filed on Jul. 10, 2009.

(51) Int. Cl.
*H01L 41/187*    (2006.01)
(52) U.S. Cl.
USPC ................. 310/358; 252/69.9 PZ
(58) Field of Classification Search
USPC ................. 310/358; 252/62.9 PZ
See application file for complete search history.

(56) References Cited

U.S. PATENT DOCUMENTS

| | | | | |
|---|---|---|---|---|
| 7,494,602 | B2 * | 2/2009 | Liufu | 252/62.9 PZ |
| 7,667,377 | B2 * | 2/2010 | Yamamoto et al. | 310/358 |
| 2007/0046152 | A1 | 3/2007 | Ifuku et al. | |
| 2008/0061263 | A1 * | 3/2008 | Kawada et al. | 252/62.9 PZ |
| 2009/0159833 | A1 * | 6/2009 | Liufu | 252/62.9 PZ |

FOREIGN PATENT DOCUMENTS

| | | | |
|---|---|---|---|
| JP | 04-145879 | A1 | 5/1992 |
| JP | 11-001768 | A1 | 1/1999 |
| JP | 2000-169224 | A1 | 6/2000 |
| JP | 2002-338349 | | * 11/2002 |
| JP | 2002-338350 | | * 11/2002 |
| JP | 2007-088446 | A1 | 4/2007 |
| JP | 2007-259700 | A1 | 10/2007 |
| WO | 2009/028348 | A1 | 3/2009 |

OTHER PUBLICATIONS

Koc, B., et al., "*Piezoelectric Ultrasonic Motors for Lens Positioning of Cellular Phone Camera Modules.*" Actuator 2006, 10th International Conference on New Actuators, Jun. 14-16, 2006, pp. 58-61.

* cited by examiner

*Primary Examiner* — Thomas Dougherty
(74) *Attorney, Agent, or Firm* — Burr & Brown

(57) ABSTRACT

There is provided a piezoelectric/electrostrictive element having little decease of Qm even in a high electric field in the case of a piezoelectric element. The piezoelectric/electrostrictive body is characterized in that the rate of Qm in an electric field of 10 V/mm is 30% or more with respect to Qm in an electric field of 1 V/mm.

13 Claims, 2 Drawing Sheets

PIEZOELECTRIC / ELECTROSTRICTIVE MATERIAL, PIEZOELECTRIC / ELECTROSTRICTIVE CERAMIC COMPOSITION, PIEZOELECTRIC / ELECTROSTRICTIVE ELEMENT, AND PIEZOELECTRIC MOTOR

FIELD OF THE INVENTION

The present invention relates to a piezoelectric electrostrictive body, a piezoelectric/electrostrictive ceramic composition, a piezoelectric/electrostrictive element, and a piezoelectric motor.

BACKGROUND OF THE INVENTION

Conventionally, piezoelectric materials have been used for ultrasonic wave motors, piezoelectric transformers, sounding bodies, actuators, sensors, and the like. For such applications, studies on the composition and the microstructure have been made for property improvement of the piezoelectric material. In addition, by the property improvement, miniaturization of the apparatuses and the elements, improvement in the energy conversion efficiency, and the like have been made.

As the piezoelectric material, there are used various materials containing so-called PZT (lead zirconate titanate) as the main component (hereinbelow referred to as a PZT based piezoelectric material). In an application for the use of resonance as in an ultrasonic wave motor or a piezoelectric transformer, it has been known that a material having a larger mechanical quality factor (Qm) is preferable because of a larger resonance displacement and little heat generation. Therefore, regarding the PZT based piezoelectric material, property improvement for raising the Qm by adding Mn or Co is tried.

In addition, it has been known that a PZT based piezoelectric material requires high temperature of about 1250° C. for firing and that Pb evaporates from about 1000° C. during the firing. When such evaporation of Pb from the piezoelectric body is caused, in a piezoelectric body obtained after the firing, there may be caused a problem of deterioration in piezoelectric properties, specifically, electromechanical coupling coefficient, relative permittivity, mechanical quality factor, or elastic compliance due to composition deviation caused by insufficient Pb or a problem of property deviation. In addition, when firing of about 1250° C. is required, an electrode material which can withstand the firing at the temperature is required for the electrode layer formed between the piezoelectric layers. Therefore, expensive platinum or an electrode material containing platinum as the main component is used, which is a factor of high cost of a piezoelectric element.

The aforementioned problems are unexceptional also with regard to an ultrasonic wave motor where a plurality of layers of piezoelectric material and electrode material are laminated. For example, the ultrasonic wave motor disclosed in Non-Patent Document 1 is a motor element using a primary vertical-secondary flexing mode and relating to a piezoelectric motor element where rectangular piezoelectric layers and electrode layers formed to divide the piezoelectric layers into two almost equally are alternately laminated. This ultrasonic wave motor also has a problem of reduction in resonance displacement because of large temperature rise of the element when it is used with a resonance frequency.

For this problem, development of a piezoelectric material having a large mechanical quality factor has been addressed. The mechanical quality factor (Qm) is the reciprocal of the coefficient of mechanical loss (tan $\delta_m$), and a large Qm means a small tan δ. When tan δ is large, heat generation upon resonance is large, and, when the element temperature rises due to the heat generation, element properties are deteriorated. Therefore, increase in mechanical quality factor has been tried.

In addition, in the case of a Pb based piezoelectric body containing Mn, Mn often has a composition which is for being added to a complex perovskite oxide having a stoichiometric composition as shown in Patent Document 1. That is, the material design is to allow Mn to be present as a phase different from the complex perovskite oxide.

[Patent Document 1] JP-A-2002-338349
[Non-Patent Document 1] Actuator 2006 Proceeding Al. 1 (Piezoelectric Ultrasonic Motors for Lens Positioning of Cellular Phone Camera Modules)

However, it is general that the mechanical quality factor is evaluated by a measurement value in a low electric field of about 1 V/mm set in the former Japan Electronic Materials Industry Association Standard (EMAS), and the evaluation was in a low electric field in comparison with an electric field used as a piezoelectric element. As a result of detailed studies in this respect, it became clear that the mechanical quality factor measured in a high electric field of, for example, 10 V/mm is small in comparison with the value in a field of 1 V/mm. In addition, it became clear that the change in the Qm value by the electric field differs depending on the material.

Therefore, when an element is manufactured with a material having a large decrease of Qm in a high electric field with respect to Qm in a low electric field, even if the resonance displacement is tried to be increased by, for example, increasing the electric field, it is impossible to obtain resonance displacement as much as expected.

In addition, in the case that a Pb based piezoelectric body contains Mn, it was found that, actually, Mn is taken into a B site of the perovskite structure in a step of firing or the like to cause a loss of the A site component with respect to the B site component, or Mn is taken into the B site to make the B site excess to allow $ZrO_2$ to deposit as a different phase as a result. In addition, both the case that the A site component has a loss and the case that $ZrO_2$ deposits as a different phase had a problem of allowing the piezoelectric properties to deteriorate.

SUMMARY OF THE INVENTION

The present invention aims to solve such problems of prior art and to provide a piezoelectric body/electrostrictive body, a piezoelectric element/electrostrictive element, and a piezoelectric motor having little decease of Qm even in a high electric field in the case of a piezoelectric element.

In addition, the present invention aims to provide a piezoelectric/electrostrictive ceramic composition capable of improving piezoelectric properties by reducing the different phase in a piezoelectric body/electrostrictive body.

In order to solve the aforementioned problems, according to the present invention, there are provided the following piezoelectric/electrostrictive body, piezoelectric/electrostrictive ceramic composition, piezoelectric/electrostrictive element, and piezoelectric motor.

According to a first aspect of the present invention, a piezoelectric/electrostrictive body is provided, wherein the rate of Qm in an electric field of 10 V/mm is 30% or more with respect to Qm in an electric field of 1 V/mm.

According to a second aspect of the present invention, a piezoelectric/electrostrictive ceramic composition is provided, comprising a complex perovskite oxide containing Pb, Sb, Nb, Mn, Ti, and Zr as main components, wherein an atomicity ratio of the atoms satisfies the following formulae:

$0.99 \leq Pb/(Sb+Nb+Mn+Ti+Zr+) \leq 1.05;$ $0.95 \leq Ti/Zr \leq 1.10;$ and $0.75 \leq Sb/Nb \leq 1.15.$ According to a third aspect of the present invention, a piezoelectric/electrostrictive ceramic composition comprising a complex perovskite oxide containing Pb, Sb, Nb, Mn, Ti, Zr, Cu, and W as main components, wherein Cu is contained at less than 0.3 mass % in terms of CuO, and the atomicity ratio of the atoms satisfies the following formulae:

$0.99 \leq Pb/(Sb+Nb+Mn+Ti+Zr+Cu+W) \leq 1.05;$ $0.95 \leq Ti/Zr \leq 1.10;$ $0.97 \leq Cu/W \leq 1.16;$ and $0.75 \leq Sb/Nb \leq 1.15.$ According to a fourth aspect of the present invention, a piezoelectric/electrostrictive element provided with a piezoelectric/electrostrictive layer and a pair of electrodes having the piezoelectric/electrostrictive layer therebetween is provided, wherein the piezoelectric/electrostrictive layer comprises the piezoelectric/electrostrictive ceramic composition according to the above second or third aspects.

According to a fifth aspect of the present invention, the piezoelectric/electrostrictive element according to the above fourth aspect is provided, wherein Ag is contained in the piezoelectric layer/electrostrictive layer.

According to a sixth aspect of the present invention, a piezoelectric motor is provided with the piezoelectric/electrostrictive element according to the above fourth or fifth aspects and characterized by using a primary vertical-secondary flexing vibration mode of the piezoelectric/electrostrictive layer.

According to a piezoelectric/electrostrictive element of the present invention, there can be provided a piezoelectric/electrostrictive body, a piezoelectric/electrostrictive element, and a piezoelectric motor having little reduction of Qm even in a high electric field. In addition, according to a piezoelectric/electrostrictive ceramic composition of the present invention, the different phase in the piezoelectric/electrostrictive body can be reduced, and firing can be performed at 1050° C or lower. Therefore, piezoelectric properties can be improved.

Figure 1:
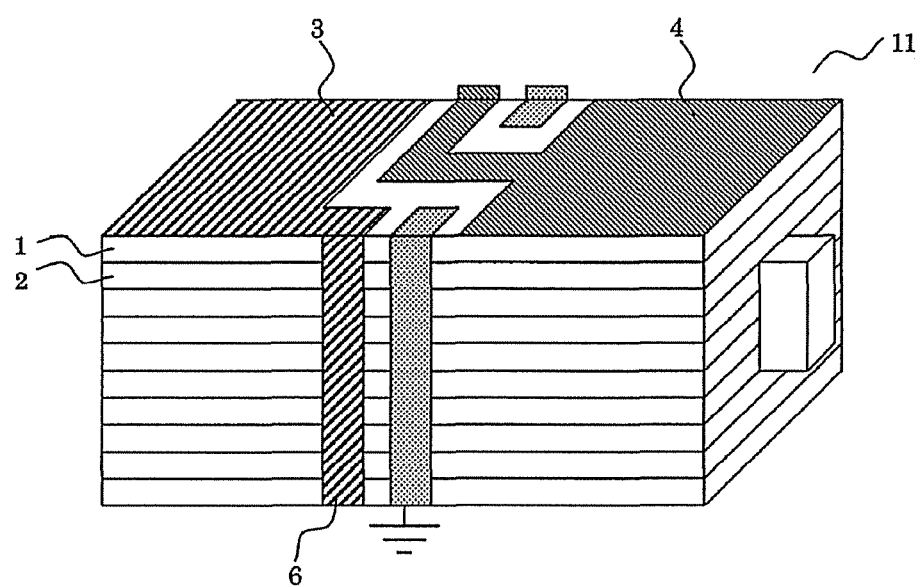
FIG. 1 is a schematic perspective view schematically showing an embodiment of a piezoelectric/electrostrictive element of the present invention.

Description of Reference Numerals 1, 2: piezoelectric/electrostrictive layer: 3: first electrode: 4: second electrode: 5: common electrode: 6: side face electrode: 11: piezoelectric element.

DETAILED DESCRIPTION OF THE INVENTION

Hereinbelow, the best mode for carrying out the present invention will be described. However, the present invention is by no means limited to the following embodiments, and it should be understood that modifications, improvements, and the like of the design may suitably be added on the basis of the ordinary knowledge of a person of ordinary skill in the art within the range of not deviating from the gist of the present invention.

Figure 2:
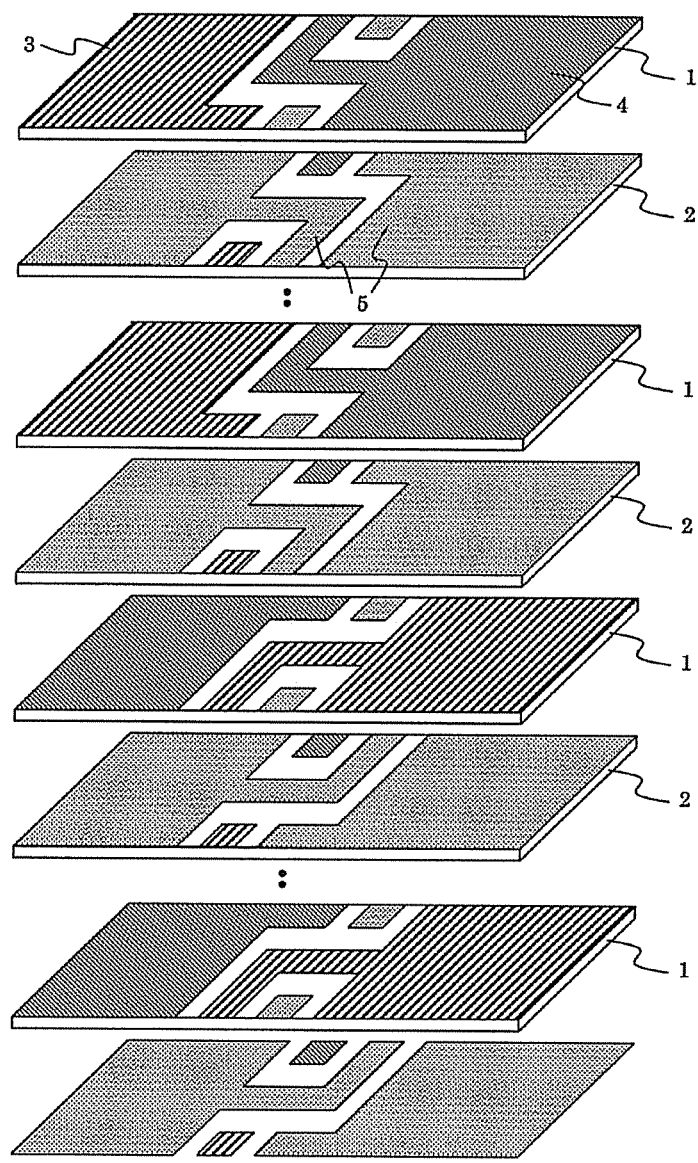
FIG. 2 is a perspective view schematically showing an embodiment of a piezoelectric/electrostrictive element of the present invention and exploded perspective view exploding, in each layer, the constitution of the piezoelectric/electrostrictive element shown in the schematic perspective view of FIG. 1 for explanation in an easily comprehensible manner.

[1] Constitution of piezoelectric element of the present invention:

A piezoelectric element 11 of the present invention is constituted basically of a piezoelectric body and a pair or more of electrodes (first electrode 3, second electrode 4) provided on the piezoelectric body as shown in Figs. 1 and 2. Here, FIG. 1 is a perspective view schematically showing an embodiment of a piezoelectric element of the present invention, and FIG. 2 is a exploded perspective view exploding, in each layer, the constitution of the piezoelectric element shown in FIG. 1 for explanation in an easily comprehensible manner. Hereinbelow, the piezoelectric/electrostrictive element will be described, and the piezoelectric element will be described mainly. Regarding the electrostrictive element, since the basic constitution is the same as that of the piezoelectric element as an element minutely elongated and contracted when voltage is applied, it is desired to refer it as the description of the piezoelectric element by replacing the piezoelectric element with the electrostrictive element.

More specifically, the piezoelectric element 11 is formed in such a manner that at least one piezoelectric layer 1 and at least one piezoelectric layer 2 of piezoelectric bodies are alternately laminated. In FIG. 1, five piezoelectric layers 1 and five piezoelectric layers 2 are alternately laminated. However, the piezoelectric element formed by alternately laminating five piezoelectric layers 1 and five piezoelectric layers 2 is merely an example, and limitation to this is not intended. The element is intended to include the case of forming a piezoelectric element by alternately combining (a) piezoelectric layer(s) 1 and (a) piezoelectric layer(s) 2.

Here, as shown in FIG. 2, the first electrode 3 and the second electrode 4 are formed on the top face of the piezoelectric layer 1 of the piezoelectric body. On the piezoelectric layer 2 formed on the bottom side of the piezoelectric layer 1, the common electrode 5 is formed. Further, on the upper face of the piezoelectric layer 1 located on the bottom side of the piezoelectric layer 2 is formed the same structure as described above, that is, the piezoelectric layer 1 having the first electrode 3 and the second electrode 4 formed on the top face.

Thus, the piezoelectric layers 1 and the piezoelectric layers 2 are alternately laminated in order. In addition, in the piezoelectric element 11, a plurality of the first electrodes 3 isolated from one another by the piezoelectric layer 1, a plurality of the second electrodes 4, and a plurality of common electrodes 5 are formed on the side faces in the lamination thickness direction, and a side face electrode 6 electrically connected is formed.

In addition, in the aforementioned piezoelectric element, it is more preferable that the temperature change rate with a resonance frequency of the piezoelectric material used for the piezoelectric body and that of the electrode material have different signs. Incidentally, "have different signs" shows inverse increase and decrease of the temperature change rates (the same can be applied to, for example, the "Young's modulus described later) as in the combination of a piezoelectric material having an increasing temperature change rate (the same can be applied to, for example, the "Young's modulus described later) in accordance with the temperature rise and a piezoelectric material having a decreasing temperature change rate (the same can be applied to, for example, the "Young's modulus described later) in accordance with the temperature rise. An embodiment where such a relation is realized is more preferable because the temperature change with the temperature change rate with the resonance frequency of the piezoelectric material and the temperature change with the temperature change rate with the resonance frequency of the electrode material can easily be balanced out to be able to reduce temperature change with the resonance frequency of the piezoelectric element.

In addition, in the aforementioned piezoelectric element, it is preferable that the electrode material is a metal material and that the temperature change rate of the Young's modulus of the piezoelectric material used for the aforementioned piezoelectric body and the temperature change rate with the Young's modulus of the metal material have different signs in the temperature range from −40 to +80° C. When improvement is tried only by a piezoelectric material, even if temperature property with the resonance frequency can be satisfied, other properties may be deteriorated. However, as in the present invention, in the case that temperature change with the Young's modulus of each of the materials constituting the piezoelectric element is controlled to be able to control temperature change with the resonance frequency of the resonator and that the changes in the Young's modulus are balanced out between the piezoelectric material and the internal electrode layer, the temperature change with the resonance frequency can be reduced as the piezoelectric element, which is preferable.

Incidentally, since the Young's modulus of the metal material used as the aforementioned electrode falls in accordance with the temperature rise, it is preferable to select a material whose Young's modulus rises according to temperature rise as the piezoelectric material.

In addition, it is preferable to constitute the piezoelectric layers and the internal electrode layers as a piezoelectric element having a columnar laminate obtained by alternate lamination and a pair of side face electrodes provided on a peripheral face of the columnar laminate and connecting internal electrode layers having the same polarization with one another.

Further, the temperature change rate with the Young's modulus of the metal material used for the internal electrode layer is preferably −8.0% or more and −1.0% or less within the temperature range from −40 to 80° C., more preferably −4.0% or more and −1.0% or less, furthermore preferably −3.0% or more and −1.0% or less, within the temperature range from −40 to +80° C.

In addition, in the aforementioned piezoelectric element, the temperature change rate with the Young's modulus of the aforementioned piezoelectric material is preferably above 0% and 4.0% or less within the temperature range from −40 to +80° C., more preferably 0.3% or more and 3.0% or less, and furthermore preferably 0.5% or more and 2.5% or less.

In addition, it is preferable that the aforementioned piezoelectric material employs a tetragonal structure as the main phase.

A piezoelectric ceramic composition of the present invention is $Pb\{(Sb_{1/2}Nb_{1/2}), Mn, Ti, Zr\}O_3$, which is a complex perovskite oxide, and has a material composition where A site elements and B site elements have stoichiometric proportion. Therefore, the composition has high piezoelectric properties and high ratio of Qm in a high electric field to Qm in a low electric field.

A piezoelectric ceramic composition of the present invention is $Pb\{(Sb_{1/2}Nb_{1/2}), Mn, Ti, Zr, (Cu_{1/2}W_{1/2})\}O_3$, which is a complex perovskite oxide and has a composition containing $(Cu_{1/2}W_{1/2})$ with the A site element and the B site element having stoichiometric proportion. Therefore, it has high piezoelectric properties and high ratio of Qm in a high electric field to Qm in a low electric field.

The ratio of Qm in an electric field of 10 V/mm to Qm in an electric field of 1V/mm is preferably 30% or more, more preferably 35% or more, and furthermore preferably 38% or more.

[1-1-1] Method for Preparing Piezoelectric Ceramic Composition:

As a method for preparing such a piezoelectric ceramic composition, there is the following method. Incidentally, a piezoelectric ceramic composition of the present embodiment may be prepared by calcining and pulverizing a mixed raw material where all the raw materials are mixed or by preparing plural kinds of secondary raw materials obtained by calcining and pulverizing a mixed raw material where part of the raw materials are mixed, followed by calcining and pulverizing the mixed raw material obtained by mixing the plural kinds of secondary raw materials and a raw material. Hereinbelow, a method for preparing a piezoelectric ceramic composition will specifically be described.

As the first method for preparing the piezoelectric ceramic composition, there is the following preparation method. In the first place, there are mixed elemental substances of Pb, Sb, Nb, Zr, Ti, Mn, Cu and W, oxides of these elements (PbO, $Pb_3O_4$, $Sb_2O_3$, $Nb_2O_5$, $TiO_2$, $ZrO_2$, MnO, $MnO_2$, CuO, $Cu_2O$, $WO_3$, and the like), carbonates ($MnCO_3$ and the like), compounds containing plural kinds of these elements ($SbNbO_2$ and the like), or the like are mixed in such a manner that the contents of the elements give a desired composition ratio. As the mixing method, a general method may be employed, and an example is a ball mill. Specifically, predetermined amounts of various raw materials, a cobbled stone, and water are put in a ball mill apparatus, which is rotated for a predetermined period to prepare mixed slurry. Then, water contained in the mixed slurry is evaporated for drying. Alternatively, water can be removed by filtration or the like to obtain a mixed raw material. After the mixed raw material is calcined at 500 to 1000° C., pulverization is conducted by the use of a general pulverization apparatus such as a ball mill, an attritor, or a beads mill to obtain a particulate piezoelectric ceramic composition.

As the second preparation method for preparing the piezoelectric ceramic composition, there is the following method. In the first place, there are mixed elemental substances of Pb, Sb, Nb, Zr, Ti, and Mn, oxides of these elements (PbO, $Pb_3O_4$, $Sb_2O_3$, $Nb_2O_5$, $TiO_2$, $ZrO_2$, MnO, $MnO_2$, and the like), carbonates ($MnCO_3$ and the like), compounds containing plural kinds of these elements ($SbNbO_2$ and the like), or the like are mixed in such a manner that the contents of the elements give a desired composition ratio. As the mixing method, a general method may be employed, and an example is a ball mill. Specifically, predetermined amounts of various raw materials, a cobbled stone, and water are put in a ball mill apparatus, which is rotated for a predetermined period to prepare mixed slurry. Then, water contained in the mixed slurry is evaporated for drying. Alternatively, water can be removed by filtration or the like to obtain a mixed raw material. After the mixed raw material is calcined at 750 to 1300° C., pulverization is conducted by the use of a general pulverization apparatus such as a ball mill, an attritor, or a beads mill to obtain a secondary raw material.

Next, elemental substances of Pb, Cu, and W, oxides of these elements (PbO, $Pb_3O_4$, CuO, $Cu_2O$, $WO_3$, and the like), and the like are mixed in such a manner that the contents of the elements give a desired composition ratio. As the mixing method, a general method may be employed, and an example is a ball mill. Specifically, predetermined amounts of various raw materials, a cobbled stone, and water are put in a ball mill apparatus, which is rotated for a predetermined period to prepare mixed slurry. Then, water contained in the mixed slurry is evaporated for drying. Alternatively, water can be removed by filtration or the like to obtain a mixed raw material. After the mixed raw material is calcined at 500 to 1000° C., pulverization is conducted by the use of a general pulverization apparatus such as a ball mill, an attritor, or a beads mill to obtain a secondary raw material.

The two kinds of secondary raw materials obtained above are mixed in such a manner that the contents of the elements give a desired composition ratio. As the mixing method, a general method may be employed, and an example is a ball mill. Specifically, predetermined amounts of various raw materials, a cobbled stone, and water are put in a ball mill apparatus, which is rotated for a predetermined period to prepare mixed slurry. Then, water contained in the mixed slurry is evaporated for drying. Alternatively, water can be removed by filtration or the like to obtain a mixed raw material. After the mixed raw material is calcined at 500 to 1000° C., pulverization is conducted by the use of a general pulverization apparatus such as a ball mill, an attritor, or a beads mill to obtain a particulate piezoelectric ceramic composition.

[1-1-2] Particulate Piezoelectric Ceramic Composition:

The particulate piezoelectric ceramic composition manufactured by the aforementioned first and second methods for preparing a piezoelectric ceramic composition preferably has an average particle diameter of 0.03 to 1.0 µm, more preferably 0.03 to 0.5 µm, and furthermore preferably 0.03 to 0.1 µm.

Incidentally, the aforementioned particle diameter may be adjusted by subjecting the piezoelectric ceramic composition powder obtained by the pulverization to a thermal treatment at 400 to 750° C. This is preferable because a finer particle is unitarily joined with another particle for forming a powder having a more uniform particle diameter, thereby giving a piezoelectric layer having a more uniform particle diameter. In addition, a piezoelectric ceramic composition may be adjusted by, for example, the alkoxide method or a coprecipitation method.

[1-2] Method for Forming Piezoelectric Layer:

As a method for forming the piezoelectric layer of the present embodiment, after slurry is obtained by adding a plasticizer, a dispersant, a solvent, and the like to a piezoelectric ceramic composition and using a general mixing apparatus such as a ball mill, a sheet-shaped layer can be formed by a general sheet-forming machine such as a doctor blade. Then, cutting was performed to form a piezoelectric layer having a desired size.

[1-3] Method for Forming First Electrode, Second Electrode, and Common Electrode:

In order to form the first electrode, the second electrode, and the common electrode between the aforementioned piezoelectric layers, they are formed on the piezoelectric layer manufactured above to have a desired size by the use of a general film-forming apparatus, for example, screen printing, and they are laminated in order, followed by a step of unitarily joining by applying pressure and firing with a heating apparatus such as an electric furnace.

[1-4] Other Piezoelectric Layers:

In addition, Ag is preferably contained in the aforementioned piezoelectric layer.

[1-5] Standing Wave Type Piezoelectric Motor:

Further, a standing wave type piezoelectric motor using a primary vertical-secondary flexing vibration mode in the aforementioned piezoelectric layers is one of desirable embodiments.

Further, the piezoelectric motor has a temperature change with a primary resonance frequency and a secondary flexing resonance frequency of preferably within 1.0%, more preferably within 0.8%, and furthermore preferably within 0.6% in the temperature range from −40 to 80° C.

EXAMPLE

Hereinbelow, the present invention will be described further specifically by Examples. However, the present invention is by no means limited to these Examples.

EXAMPLE 1

Each raw material was weighed out to have a proportion of PbO of 68.4 mass %, $TiO_2$ of 11.5 mass %, $ZrO_2$ of 17.1 mass %, $Sb_2O_3$ of 0.88 mass %, $Nb_2O_5$ of 0.80 mass %, and $MnCO_3$ of 0.48 mass % in terms of MnO, and they were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 1000° C. in an electric furnace for calcination and synthesis. The resultant calcined material was subjected to pulverization again for a predetermined time with a predetermined amount of water by a ball mill and evaporation/drying in a hot air drier to obtain the first secondary raw material.

Next, each raw material was weighed out to have a proportion of PbO of 58.9 mass %, CuO of 10.5 mass %, and $WO_3$ of 30.6 mass %, and they were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 800° C. in an electric furnace for calcination and synthesis. The resultant calcined material was subjected to pulverization again for a predetermined time with a predetermined amount of water by a ball mill and evaporation/drying in a hot air drier to obtain the second secondary raw material.

The first secondary raw material and the second secondary raw material prepared above were weighed out to have a proportion of 97.68 mass % and 2.32 mass %, respectively, and were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 800° C. in an electric furnace for calcination and synthesis. The resultant calcined material was subjected to pulverization again for a predetermined time with a predetermined amount of water by a ball mill and evaporation/drying in a hot air drier to obtain a piezoelectric ceramic composition.

The piezoelectric ceramic composition obtained above was investigated by chemical analysis to find the proportion of Pb of 68.6 mass % in terms of PbO, Ti of 11.3 mass % in terms of $TiO_2$, Zr of 16.9 mass % in terms of $ZrO_2$, Sb of 0.83 mass % in terms of $Sb_2O_3$, Nb of 0.78 mass % in terms of $Nb_2O_5$, Mn of 0.45 mass % in terms of MnO, Cu of 0.23 mass % in terms of CuO, W of 0.65 mass % in terms of $WO_3$, and Hf of 0.35 mass % in terms of $HfO_2$. Here, $HfO_2$ was an inevitable component contained in a $ZrO_2$ raw material.

After the piezoelectric ceramic composition powder manufactured in this way was formed under pressure into a disc shape having a diameter of 20 mm and a thickness of 7 mm, it was put in a magnesia sheath and fired at 950° C. for three hours in an electric furnace to manufacture a piezoelectric ceramic bulk. The piezoelectric ceramic bulk was machined to have a shape of 12 mm×3 mm×1 mm. On the two faces of 12 mm×3 mm, Ag paste was applied and thermally treated to obtain a test piece. The test piece was subjected to a polarization treatment by applying an electric field of 3 kV/mm for 15 minutes in silicon oil at 140° C.

EXAMPLE 2

After press-forming into a disc shape having a diameter of 20 mm and a thickness of 7 mm as in Example 1 by the use of only the first secondary raw material in Example 1, the formed article was put in a magnesia sheath and fired at 1250° C. for 3 hours in an electric furnace to obtain a piezoelectric ceramic bulk. The piezoelectric ceramic bulk was machined to have a shape of 12 mm×3 mm×1 mm. On the two faces of 12 mm×3 mm, Ag paste was applied and thermally treated to obtain a test piece. The test piece was subjected to a polarization treatment by applying an electric field of 3 kV/mm for 15 minutes in silicon oil at 140° C. Incidentally, even when the material of Example 2 was fired at 950° C. as in Example 1, it was not densified because it contains neither Cu nor W.

COMPARATIVE EXAMPLE 1

Each raw material was weighed out to have a proportion of PbO of 63.7 mass %, TiO$_2$ of 10.9 mass %, ZrO$_2$ of 16.9 mass %, Sb$_2$O$_3$ of 0.83 mass %, Nb$_2$O$_5$ of 0.76 mass %, and MnCO$_3$ of 0.43 mass % in terms of MnO to obtain the first secondary raw material in the same manner as in Example 1. The first secondary raw material and the same second secondary raw material as in Example 1 were weighed out to have a proportion of 93.53 mass % and 6.47 mass %, respectively, to obtain a piezoelectric ceramic composition in the same manner as in Example 1. Further, from the piezoelectric ceramic composition, a piezoelectric ceramic bulk was manufactured. The piezoelectric ceramic composition of Comparative Example 1 had a composition where MnO was added to a complex perovskite oxide of Pb{(Sb$_{1/2}$Nb$_{1/2}$) TiZr}O$_3$ to have a loss of 2% of Pb.

In the case of Comparative Example 1, Pb/(Sb+Nb+Mn+Ti+Cu+W)=0.982, which is outside the range of the present invention.

(Evaluation Method)

Here, the Qm measurement method will be described. The piezoelectric ceramic bulk subjected to a polarization treatment was held with a probe from the top and the bottom in the center of each of the faces of 12 mm×3 mm. With applying a predetermined voltage to the piezoelectric ceramic bulk by means of the probe, sweeping is performed from the low frequency side with respect to resonant frequency to the high frequency side. The vibration velocity of a piezoelectric ceramic bulk during the voltage application was measured by irradiating a laser Doppler on an end face of 3 mm×1 mm of the piezoelectric ceramic bulk. By integrating the result with time, the displacement can be obtained. The frequency $f_{max}$ when the displacement was maximum and the frequencies $f_1$ and $f_2$ when the frequency was half the maximum were obtained, and Qm was obtained by the following formula Qm.

$$Q_m = f_{max}/(f_2 - f_1)$$

(Evaluation Result)

Qm in each of Examples 1, 2 and Comparative Example 1 described above was measured and evaluated in both the cases of an electric field of 1 V/mm and an electric field of 10 V/mm, and the ratio of Qm in the electric field of 10 V/mm to Qm in the electric field of 1 V/mm is shown in Table 1.

TABLE 1

|  | Ratio (%) |
|---|---|
| Example 1 | 40 |
| Example 2 | 32 |
| Comp. Ex. 1 | 28 |

From the results, in Examples 1 and 2, the ratios of Qm in the electric field of 10 V/mm to Qm in the electric field of 1 V/mm were 40% and 32%, respectively, which were high, while, in Comparative Example 1, the ratio was 28%, which was low.

EXAMPLE 3

Each raw material was weighed out to have a proportion of PbO of 68.4 mass %, TiO$_2$ of 11.5 mass %, ZrO$_2$ of 17.1 mass %, Sb$_2$O$_3$ of 0.88 mass %, Nb$_2$O$_5$ of 0.80 mass %, and MnCO$_3$ of 0.48 mass % in terms of MnO, and they were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 1000° C. in an electric furnace for calcination and synthesis. The resultant calcined material was subjected to pulverization again for a predetermined time with a predetermined amount of water by a ball mill and evaporation/drying in a hot air drier to obtain the first secondary raw material.

Next, each raw material was weighed out to have a proportion of PbO of 58.9 mass %, CuO of 10.5 mass %, and WO$_3$ of 30.6 mass %, and they were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 800° C. in an electric furnace for calcination and synthesis. The resultant calcined material was subjected to pulverization again for a predetermined time with a predetermined amount of water by a ball mill and evaporation/drying in a hot air drier to obtain the second secondary raw material.

The first secondary raw material and the second secondary raw material prepared above were weighed out to have a proportion of 97.68 mass % and 2.32 mass %, respectively, and were mixed with a predetermined amount of water for 24 hours by a ball mill. Then, the prepared slurry was put in a hot air drier and evaporated and dried. The resultant mixed raw material was put in a magnesia sheath, covered with a magnesia lid, and heated at 800° C. in an electric furnace for calcination and synthesis. The resultant calcined material was subjected to pulverization again for a predetermined time with a predetermined amount of water by a ball mill and evaporation/drying in a hot air drier to obtain a piezoelectric ceramic composition.

The thus obtained piezoelectric ceramic composition was mixed with a dispersant, a plasticizer, and a solvent to prepare slurry, and a piezoelectric ceramic sheet was formed by a doctor blade method. The piezoelectric ceramic sheet was manufactured to have a thickness of 40 µm after firing. Thirty six piezoelectric ceramic sheets each having 70 mass % Ag-30 mass % Pd electrode material paste printed and formed thereon into a predetermined shape were laminated to manufacture a green sheet laminate. After the thickness of the electrode material after firing was adjusted to 1.5 µm. After the green sheet laminate was fired at 900° C. in an electric furnace and then machined to have a length of 5.0 mm, a width of 1.5 mm, and a thickness of 1.5 mm, a side face electrode was formed with a 70 mass % Ag-30 mass % Pd electrode material paste to obtain a piezoelectric element.

The piezoelectric element obtained above was subjected to chemical analysis to check the proportion of the ceramic component excluding the electrode component in the total amount with assuming that each of the components was a predetermined oxide. As the method, they were completely dissolved by acid and analyzed by the use of the ICP apparatus. The results are shown in Table 2. Here, piezoelectric elements employing different piezoelectric ceramic composition lots were analyzed. Incidentally, $HfO_2$ here is an inevitable component contained in $ZrO_2$ raw material.

TABLE 2

|  | Lot 1 | Lot 2 |
|---|---|---|
| PbO | 68.64 | 68.43 |
| $Sb_2O_3$ | 0.62 | 0.85 |
| $Nb_2O_5$ | 0.71 | 0.70 |
| $TiO_2$ | 11.46 | 11.47 |
| $ZrO_2$ | 17.14 | 17.00 |
| MnO | 0.45 | 0.45 |
| CuO | 0.23 | 0.24 |
| $WO_3$ | 0.43 | 0.53 |
| $HfO_2$ | 0.32 | 0.32 |

COMPARATIVE EXAMPLE 2

In Comparative Example 2, a piezoelectric element was manufactured in the same method as in Example 3 by the use of the piezoelectric ceramic composition manufactured in Comparative Example 1.

(Evaluation)

The results of measurement and evaluation of the displacement upon resonance in Example 3 and Comparative Example 2 are shown in Table 3. As the displacement upon resonance, the ratios of the displacements in the electric fields of 2 V/mm and 3 V/mm to the displacement in the electric field of 1 V/mm are shown.

TABLE 3

|  | 1 V/mm | 2 V/mm | 3 V/mm |
|---|---|---|---|
| Example 3 | 100% | 178% | 252% |
| Comp. Ex. 2 | 100% | 150% | 182% |

While the resonance displacement was 252% even when the electric field was 3 V/mm, which is three times, in Example 3, the resonance displacement was reduced to 182% though the electric field was 3 V/mm, which is three times, in Comparative Example 2.

The present invention can be used for ultrasonic wave motors, piezoelectric/electrostrictive elements of sounding bodies, actuators, and sensors, piezoelectric/electrostrictive ceramic compositions, piezoelectric motors, and the like. In addition, according to a piezoelectric/electrostrictive element of the present invention, there can be provided a piezoelectric/electrostrictive element having high Qm and little decrease in piezoelectric properties even in a high electric field.

What is claimed is:

1. A piezoelectric/electrostrictive element provided with a piezoelectric/electrostrictive layer and a pair of electrodes having the piezoelectric/electrostrictive layer therebetween; wherein the piezoelectric/electrostrictive layer comprises a piezoelectric/electrostrictive ceramic composition comprising a complex perovskite oxide containing Pb, Sb, Nb, Mn, Ti, and Zr as main components, wherein an atomicity ratio of the atoms satisfies the following formulae:

$$0.99 \leq Pb/(Sb+Nb+Mn+Ti+Zr) \leq 1.05;$$

$$0.95 \leq Ti/Zr \leq 1.10; \text{ and}$$

$$0.75 \leq Sb/Nb \leq 1.15; \text{ and}$$

wherein Ag is contained in the piezoelectric/electrostrictive layer.

2. The piezoelectric/electrostrictive element according to claim 1, wherein the piezoelectric/electrostrictive layer exhibits a rate of Qm in an electric field of 10 V/mm is 30% or more with respect to a Qm in an electric field of 1 V/mm.

3. A piezoelectric motor provided with the piezoelectric/electrostrictive element according to claim 1, characterized by using a primary vertical-secondary flexing vibration mode of the piezoelectric/electrostrictive layer.

4. A piezoelectric /electrostrictive ceramic composition comprising a complex perovskite oxide containing Pb, Sb, Nb, Mn, Ti, Zr, Cu, and W as main components, wherein Cu is contained at less than 0.3 mass % in terms of CuO and the atomicity ratio of the atoms satisfies the following formulae:

$$0.99 \leq Pb/(Sb+Nb+Mn+Ti+Zr+Cu+W) \leq 1.05;$$

$$0.95 \leq Ti/Zr \leq 1.10;$$

$$0.97 \leq Cu/W \leq 1.60; \text{ and}$$

$$0.75 \leq Sb/Nb \leq 1.15.$$

5. A piezoelectric/electrostrictive element provided with a piezoelectric/electrostrictive layer and a pair of electrodes having the piezoelectric/electrostrictive layer therebetween; wherein the piezoelectric/electrostrictive layer comprises the piezoelectric/electrostrictive ceramic composition according to claim 4.

6. The piezoelectric/electrostrictive element according to claim 5, wherein Ag is contained in the piezoelectric/electrostrictive layer.

7. A piezoelectric motor provided with the piezoelectric/electrostrictive element according to claim 5, characterized by using a primary vertical-secondary flexing vibration mode of the piezoelectric/electrostrictive layer.

8. A piezoelectric motor provided with the piezoelectric/electrostrictive element according to claim 6, characterized by using a primary vertical-secondary flexing vibration mode of the piezoelectric/electrostrictive layer.

9. A piezoelectric/electrostrictive body having the piezoelectric/electrostrictive ceramic composition according to claim 4, wherein the piezoelectric/electrostrictive body exhibits a rate of Qm in an electric field of 10 V/mm of 30% or more with respect to a Qm in an electric field of 1 V/mm.

10. A piezoelectric/electrostrictive body having the piezoelectric/electrostrictive ceramic composition according to claim 4.

11. A piezoelectric/electrostrictive body having the piezoelectric/electrostrictive ceramic composition according to claim 4, wherein Ag is contained in the piezoelectric/electrostrictive composition.

12. A piezoelectric/electrostrictive element having the piezoelectric/electrostrictive ceramic composition according to claim 4, wherein the piezoelectric/electrostrictive element exhibits a rate of Qm in an electric field of 10 V/mm of 30% or more with respect to a Qm in an electric field of 1 V/mm.

13. A piezoelectric/electrostrictive motor provided with the piezoelectric/electrostrictive element according to claim 12, wherein said motor uses primary vertical-secondary flexing vibration mode of the piezoelectric/electrostrictive layer.

* * * * *